United States Patent [19]
Sur et al.

[11] Patent Number: 5,877,562
[45] Date of Patent: Mar. 2, 1999

[54] PHOTO ALIGNMENT STRUCTURE

[76] Inventors: Harlan Sur, 2054 W. 136 Ave., San Leandro, Calif. 94577; Subhas Bothra, 1762 Willow Lake La., San Jose, Calif. 95131

[21] Appl. No.: 925,040

[22] Filed: Sep. 8, 1997

[51] Int. Cl.$^6$ .................................................. H01L 23/58
[52] U.S. Cl. ........................ 257/797; 438/401; 438/462; 430/644
[58] Field of Search ................... 438/401, 693, 438/633, 301; 257/797

[56] References Cited

U.S. PATENT DOCUMENTS

| | | | |
|---|---|---|---|
| 5,369,050 | 11/1994 | Kawai | 438/60 |
| 5,401,691 | 3/1995 | Caldwell | 438/633 |
| 5,503,962 | 4/1996 | Caldwell | 430/317 |
| 5,578,519 | 11/1996 | Cho | 438/301 |
| 5,640,053 | 6/1997 | Caldwell | 257/797 |
| 5,643,406 | 7/1997 | Shimomura | 438/693 |

*Primary Examiner*—Charles Bowers
*Assistant Examiner*—Craig Thompson

[57] ABSTRACT

A photo alignment structure integral with a substrate enables the alignment apparatus to receive a reflected light signature of the surface topography of the alignment structure. As the circuit is constructed, the alignment target may be built in tandem with the process. The alignment structure is constructed so that its surface will retain sufficient topography to enable the alignment apparatus to properly align.

4 Claims, 7 Drawing Sheets

☐ SUBSTRATE

▨ FIRST DIELECTRIC LAYER

▨ FIRST CONDUCTIVE LAYER

▨ SECOND CONDUCTIVE LAYER

- SUBSTRATE
- FIRST CONDUCTIVE LAYER
- SECOND CONDUCTIVE LAYER
- FIRST DIELECTRIC LAYER
- SECOND DIELECTRIC LAYER
- THIRD CONDUCTIVE LAYER

Fig. 4E

- SILICON SUBSTRATE
- POLY SILICON
- FIELD OXIDE
- S/D  SOURCE/DRAIN
- APPLIED OXIDE
- TUNGSTEN
- METALIZATION I

| | | |
|---|---|---|
| SILICON SUBSTRATE | APPLIED OXIDE | METALIZATION II |
| POLY SILICON | TUNGSTEN | |
| FIELD OXIDE | METALIZATION I | |
| S/D SOURCE/DRAIN | SECOND INTERMETAL DIELECTRIC | |

PHOTO ALIGNMENT STRUCTURE

FIELD OF INVENTION

This invention relates to the field of semiconductor manufacturing. More particularly, it pertains to the fabrication of semiconductor wafers in connection with photolithography processes.

BACKGROUND OF INVENTION

The manufacturing of integrated circuits (ICs) requires many process steps which are executed with precision and accuracy. Precision is important in that the ultimate dimensions are becoming smaller and smaller, on order of less than one micron. Accuracy is important in that the related process steps are often repeatable over time within a controlled range.

A significant part of many wafer manufacturing processes involves photolithography. Photolithography involves taking an image of a part of the electronic circuit, rendering this part of the circuit onto a photographic plate, sometimes referred to as a photomask; and using the photomask and a light source to print that image onto a silicon wafer upon which a light-sensitive emulsion, or a photoresist, has been applied. The exposed photoresist is developed to reveal the desired circuit elements.

Other processes and treatments complete the layer for a given part of the electronic circuit. A given electronic circuit may have a number of photolithographic steps. The number of photolithographic steps often increase as circuits become more and more complex.

Two apparatuses used for printing a mask pattern onto a silicon wafer are the "projection aligner" and the "stepper".

Figure 1A:
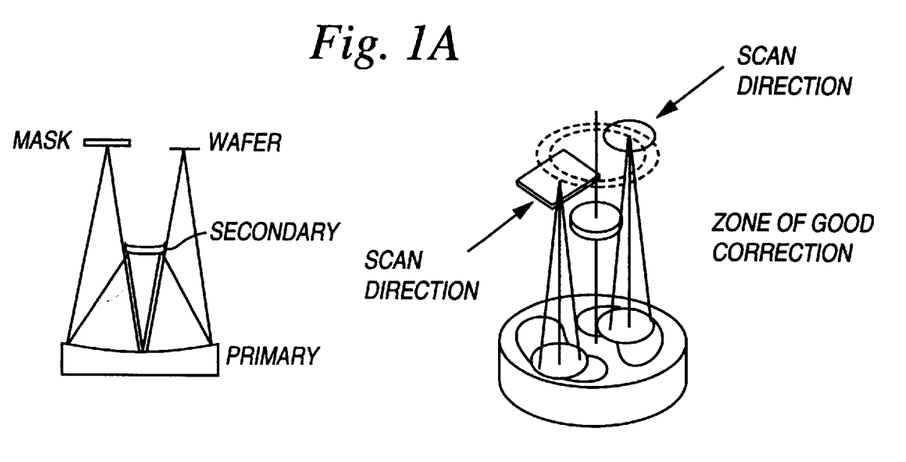
FIGS. 1a, 1b, and 1c respectively illustrate a conventional projection aligner, a conventional stepper, and a top view of an embodiment of an alignment target, in accordance with an aspect of the present invention.

FIG. 1a shows an example of a "projection aligner's" view of the alignment structure. In projection aligner printing, typically all of the product die on the wafer are printed simultaneously. For example, if a wafer substrate has the capacity to hold 150 die, the mask will have 150 images on it. The printing is at a 1:1 ratio. In one typical projection aligner system, for example, the optical system includes two reflecting surfaces. The light, typically, supplied by a high energy source (e.g., a mercury lamp), passes through a point on the photomask to a primary mirror. The light bounces off the primary mirror onto a secondary mirror. From the secondary mirror, it again bounces back to the primary mirror. Here the image on the photomask is projected onto the wafer substrate. To assure accurate alignment, the apparatus relies upon receiving a reflected light signature of the wafer substrate's alignment target so that it can be aligned with the photomask's corresponding marks.

One or more of these alignment structures are placed about a silicon wafer substrate to aid in aligning the plurality of photolithography steps used in a typical sub-micron process to manufacture a semiconductor device. Subsequent layers' photomasks have corresponding alignment marks on them which correspond to those marks printed previously on the silicon wafer substrate. Consequently, inter-layer alignment is maintained throughout the building of the semiconductor device.

Figure 1B:
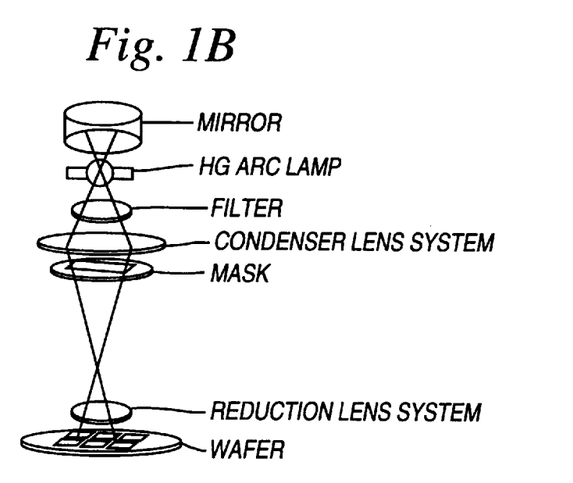

FIG. 1b shows an application of an example embodiment in a photolithography process which uses "steppers". In using steppers, one pattern of a layer of the semiconductor device is placed on a reticle. The image on the reticle may be about 5 times larger than the final printed image on the wafer. The stepper optics reduce the reticle size image to the final device size. As a wafer is printed, the "stepper" aligns to the previously printed die. The wafer steps along and the aligner prints one die at a time. Each die has at least one of these novel alignment marks to assure alignment throughout the building of the semiconductor device.

Each step builds an additional layer of the circuit upon the previously built ones. To assure that the layers line up with one another, the subsequent layers are printed relative to the first.

Alignment structures are sometimes included with the electronic circuit as part of its set of photomasks. These structures enable the alignment apparatus to reference correctly the current mask plate's image with the previously printed patterns on the wafer substrate. Typically, the alignment apparatus measures the reflected light off the surface topography of the alignment structure of the wafer. This reflected light "signature" enables the instrument to properly reference the subsequent photomask's alignment structure to that on the wafer, thereby permitting proper connections between the circuits.

The trend of printing smaller and smaller geometries has made the process of aligning wafers more difficult. Topographical properties of each layer printed on the wafer substrate provide a reflected light signature for the aligner. The properties of the surface topography which are useful for alignment impose significant limitations on the ability to shrink down the geometries of the semiconductor devices and to build additional layers. Consequently, as the technology approaches the sub-micron range, the process strives to smooth out these topographical properties.

SUMMARY OF INVENTION

The present invention is exemplified in a number of implementations, several of which are summarized below. According to one embodiment, a photo alignment structure integral with a substrate comprises: a first layer having a top surface and a bottom surface, the top layer of the first layer having at least one alignment opening therein extending from substantially cornered top edges at the top surface toward the bottom surface; and a conductive layer having substantially cornered top edges of the first layer and to the alignment opening of the first layer, the substantially cornered edges defining a depression sufficiently distinct to allow an alignment apparatus to recognize a topography change.

According to another embodiment, a photo alignment structure integral with a substrate comprises: a first dielectric layer having a top surface and a bottom surface, the bottom surface coupled with the substrate; a lower conductive layer with an opening therein, the opening extending to the top surface of the first dielectric layer; a second dielectric layer over the lower conductive layer outside the opening; an upper conductive layer having upper and lower surfaces, each conforming to and covering the alignment opening; and another conductive layer covering the upper conductive layer and having a depression situated over the alignment opening and defined by edges substantially cornered to allow an alignment apparatus to recognize a topography change via a characteristic of reflected light. For example, this characteristic can be the change in the intensity of the reflected light.

Another embodiment exemplifies a process implementation in connection with the present invention. The process is a method of building a photo alignment structure integral with a substrate. The method comprises the steps of: depositing a first layer over the substrate; defining at least one opening in the first layer; and depositing a conductive layer over the opening of the dielectric layer to form a depression sufficiently distinct to enable an alignment apparatus to recognize a topography change.

Yet another aspect of the present invention is directed to a method of building a photo alignment structure integral with a substrate. The method comprises the steps of: depositing a first layer over the substrate; defining at least one opening in the first dielectric layer; depositing a first conductive layer over the opening of the first layer conforming to the opening forming a depression therein; and depositing a second conductive layer conforming to the depression of the first conductive layer, form a pattern sufficiently distinct to enable an alignment apparatus to recognize a topography change.

The above summary of the present invention is not intended to represent each disclosed embodiment, or every aspect, of the present invention. Other aspects and example embodiments are provided in the figures and the detailed description which follow.

BRIEF DESCRIPTION OF THE DRAWINGS

Objects and advantages of the invention will become apparent upon reading the following detailed description and upon reference to the drawings in which.

While the invention is susceptible to various modifications and alternative forms, specific embodiments thereof have been shown by way of example in the drawings and well herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The present invention is believed to be applicable to a variety of semiconductor manufacturing processes and to a variety of materials. The present invention has been found to be particularly beneficial in applications and related environments involving the fabrication of semiconductor wafers using photolithography processes. The example embodiments described below are presented in this latter context.

Figure 1C:
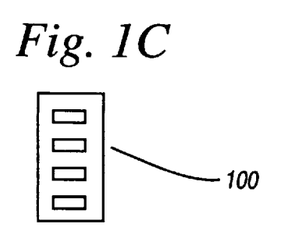

Referring now to the drawings, FIG. 1c shows a top view looking down upon the wafer substrate embodiment of the novel alignment structure as used in FIGS. 1a and FIG. 1b. In modern sub-micron processes, steppers rely on the reflected light signature at a sufficiently defined edge for alignment purposes. The use of very planar processes, for example a tungsten chemical mechanical polishing (CMP) process as opposed to the many conventional tungsten etchback processes, renders edges whose definition is insufficient for the stepper to distinguish. Consequently, the aligner cannot accurately align features on the wafer substrate with the next layer's features on the printing photomask. This novel alignment target alleviates this problem.

FIG. 2 shows a cross-sectional view of the alignment structure 100 as is shown in FIG. 1c, according to a particular embodiment of the present invention. The alignment structure (FIG. 2a) begins with a wafer substrate 110. As shown in FIG. 2b, a first dielectric layer 120 is applied to the substrate. A chemical vapor deposition (CVD), a plasma aided chemical vapor deposition (PACVD), or equivalent process may be used. In a standard process a dielectric is often comprised of silicon oxide compounds, silicon nitride compounds or combinations, thereof. Such a process, for example, will apply this layer in the range of 0.5 to 2.0 microns.

Figure 2A:
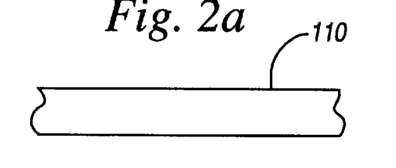
FIGS. 2a–2f illustrate an outline of the structure and the steps in one embodiment of an alignment target, according to the present invention.
Figure 2B:
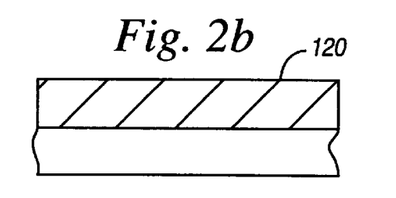
Figure 2C:
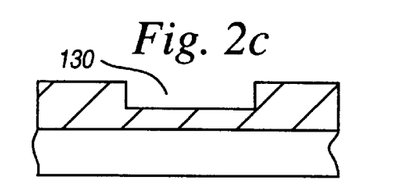

In FIG. 2c, after application of the first dielectric layer 120, a trench 130 is formed within the dielectric layer 120. Such a trench structure is defined by applying a photoresist on the first dielectric layer 120 previously deposited. Then, in an alignment apparatus, a photomask pattern of the trench structure is printed onto the first dielectric layer. The area which becomes the trench is exposed and can be etched by number of processes, typically a liquid or plasma process. Those unexposed areas, protected by the undeveloped photoresist will remain. The trench is etched to a depth just slightly less than the overall thickness of the first dielectric layer. For example, in a CMP process, this trench is etched approximately, 0.3 microns less than the overall thickness of the first dielectric layer. The length or width of this trench is typically in the range of 1.0 to 5.0 microns In other processes, the trench can be slightly deeper or shallower and its width and length would vary proportionally.

Figure 2D:
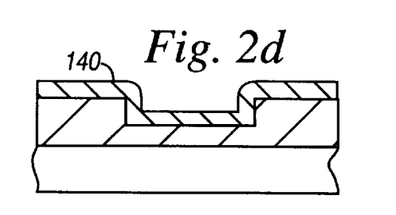

Referring now to FIG. 2d, a first conductive layer 140, usually comprised of tungsten (W) is deposited via a CVD process. The first conductive layer 140 will conform to the trench 130 and features of the first dielectric layer 120. The first conductive layer is not limited to tungsten. Other metals applied with a CVD process also have the conformal property of tungsten. For example, in a CMP process, the thickness of the first conductive layer is in the range of 0.3 to 0.8 microns.

Figure 2E:
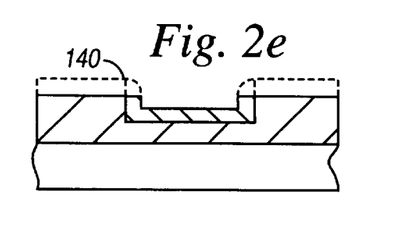

After the deposition of the first conductive layer 140 as shown in FIG. 2d, in a modern sub-micron process, chemical mechanical polishing (CMP) as shown in FIG. 2e, will remove substantially all of the first conductive layer from the dielectric other than that present in the trench 130. The CMP forms a step over the alignment target opening which is preserved during the tungsten CMP because the tungsten surface in the opening is deeper than the surrounding oxide. The dashed lines indicate the areas where the first conductive layer is removed.

The remaining tungsten in the trench provides the necessary relief in that this embodiment of the alignment structure assures that the reflected light sensing methodology of the aligner can detect a topographical change and therefore, have a targeting point upon which to lock in alignment of the photomask with respect to the previously printed layers on the wafer substrate.

Figure 2F:
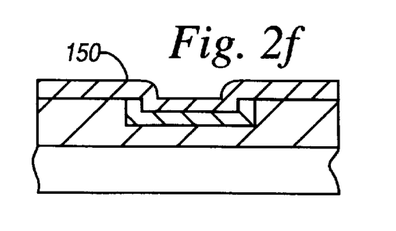

In FIG. 2f, the process applies a second conductive layer 150 which substantially conforms to the resulting structure of 140. Such a second conductive layer in a typical wafer process comprises an aluminum copper alloy. This tungsten surface which is deeper than the surrounding oxide is preserved after the application of the second conductive layer 150. Consequently, the step created by the first conductive layer 140, is preserved. For example, as in the application of the first conductive layer, the thickness ranges from 0.3 to 0.8 microns.

FIG. 3. illustrates a cross section 200 according to another embodiment of the present invention. The alignment structure begins with a wafer substrate 210 of FIG. 3a. FIG. 3b shows a first dielectric layer 220 is applied, for example, by CVD or PACVD deposition. Again this dielectric can be comprised of silicon oxide compounds, silicon nitride compounds or combinations, thereof. The process applies the first dielectric in the range of 0.5 to 2.0 microns.

Figure 3A:
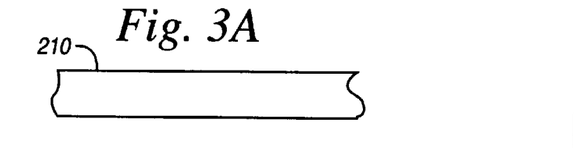
FIGS. 3a–3i illustrate an outline of the structure and steps in another embodiment of an alignment target, also according to the present invention.
Figure 3B:
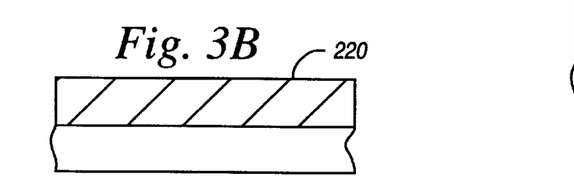
Figure 3C:
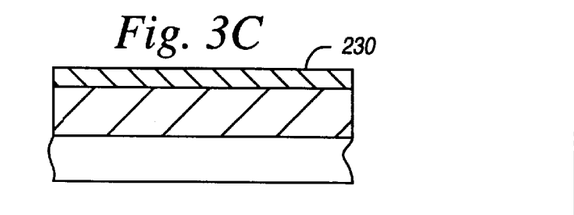

After the application of the first dielectric layer 220 in FIG. 3b, a first conductive layer 230 is deposited on the first dielectric layer, FIG. 3c. Typically, such a metal such as an alloy of aluminum and copper or other metal type is applied or sputtered onto the dielectric.

Figure 3D:
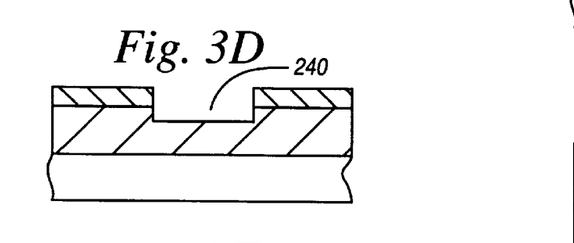

Next in FIG. 3d, the process forms a trench 240 within the first conductive layer 230 and first dielectric layer 220. The process defines the trench structure by applying a photoresist on the first conductive layer 230. By exposing the photoresist, an alignment apparatus prints a photomask pattern of the trench structure onto the first conductive layer 230. A liquid or plasma etch as in a typical process will etch the exposed area. Those unexposed areas, protected by the undeveloped photoresist will remain. The process will etch the trench 240 to a depth just slightly less than the overall thickness of the first dielectric layer 220 and first conductive layer 230 composite structure. For example, in a CMP process, this trench is etched to a depth approximately 0.3 microns less than the overall thickness of the composite structure and the trench has a length and width in the range of 1.0 to 5.0 microns.

Figure 3E:
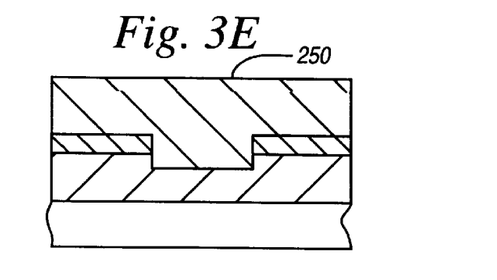

In FIG. 3e, the process continues by applying a second dielectric layer 250 over the trench structure defined in the previous paragraph. For example, a CVD or PACVD process will form and deposit this material typically comprised of silicon oxide compounds, silicon nitride compounds or combinations, thereof. The thickness of the second dielectric layer is on the order ot that of the first dielectric layer.

Figure 3F:
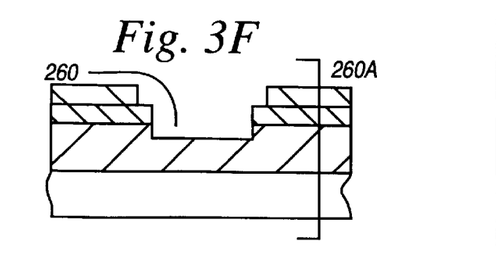

As shown in FIG. 3f, the process forms again the trench structure into the second dielectric by applying a photoresist on the second dielectric layer 250. By exposing the photoresist, an alignment apparatus prints a photomask pattern of the trench structure onto the second dielectric layer 250. A liquid or plasma etch as in a typical process will etch the exposed area, 260. Those unexposed areas, protected by the undeveloped photoresist will remain. The process will etch the trench 240 to a depth just slightly less than the overall thickness of the second dielectric layer 250, the first conductive layer 230, and first dielectric layer 220 composite structure 260a. For example, the process will etch to a depth in the range 1.6 to 5.6 microns of the composite thickness of the aforesaid composite structure.

Figure 3G:
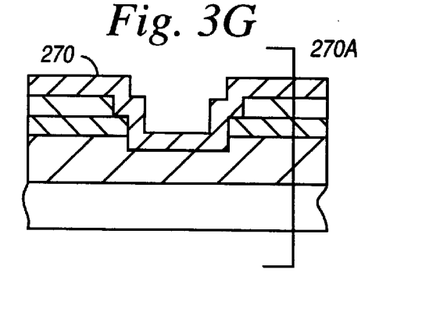

Next an apparatus applies a second conductive, layer 270 as shown in FIG. 3g, for example, comprised of tungsten (W) or an alloy thereof. Typically, a CVD process is used. The second conductive layer 270 will conform to the features of the composite structure 260a, created thus far. The thickness of the second conductive layer for one particular application, is in the range of 0.3 to 0.8 microns.

Figure 3H:
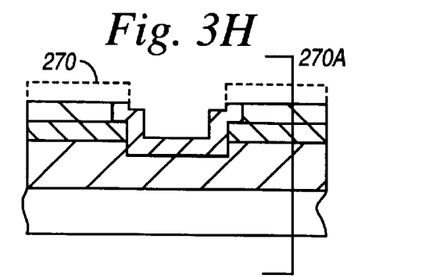

In FIG. 3h, after the deposition of the second conductive layer 270, a modern sub-micron process, involves the removal of substantially all the second conductive layer 270 from the composite structure 270a using CMP, as indicated by the dashed lines. Only the trench structure 270a remains coated with the second conductive layer.

Figure 3I:
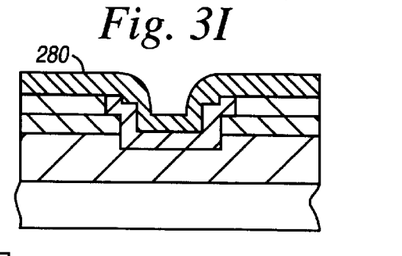

Upon the trench structure 270a in FIG. 3i, the CVD apparatus deposits a third conductive layer 280. The range of thickness typically is from 0.3 to 8.0 microns. The third conductive layer 280, as shown in FIG. 3i, substantially conforms to the underlying structure, preserving a topography which will enable the aligner to receive a sufficient reflected light signature upon which to accomplish alignment.

FIG. 4 outlines a series of steps in the making of an alignment structure in a typical modern process and the corresponding layers of the integrated circuit. The two structures are built simultaneously in a typical modern process. In the example here, a transistor structure along with the alignment target is being built until the deposition of the circuit's "first metal layer."

Figure 4A:
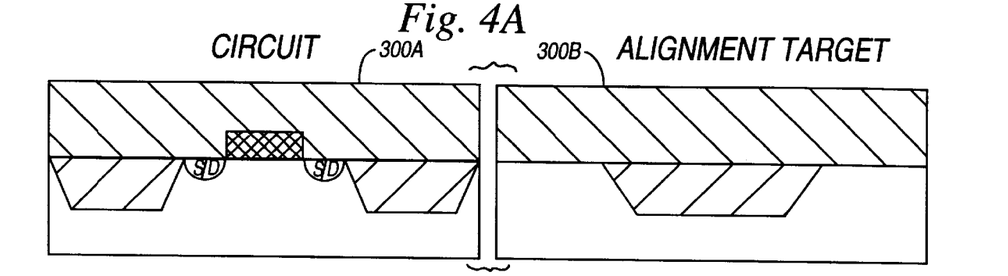
FIGS. 4a–4e illustrate a building-block outline for an embodiment of the inventive alignment structure.

Beginning with FIG. 4a, this example process has completed the building of a field oxide isolation. To understand the circuit structure, refer to the shading and hatch patterns of the drawing. The process deposited additional oxide 300a and 300b, upon the already constructed field oxide structure. The thickness of oxide, for the example application, ranges from 0.4 microns to 1.2 microns.

Figure 4B:
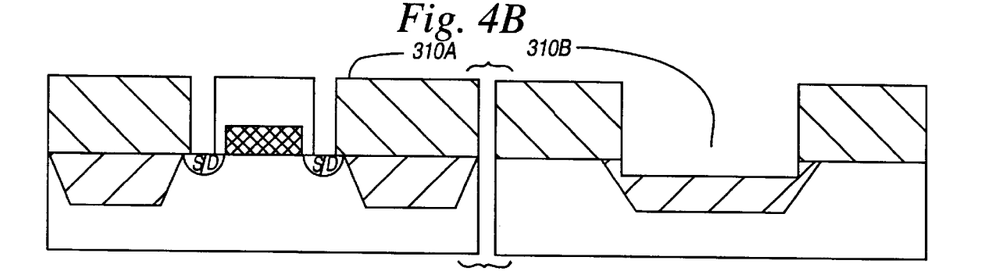

Next, the process does a contact etch and the resulting structure is shown in FIG. 4b. The process substantially removed the field oxide and additional oxide of 300b and forms a trench 310b in the alignment structure. Correspondingly, the oxide has been removed from the source and drain structure of the circuit as shown in 310a. The depth of this trench ranges from 0.8 microns to 1.6 microns.

Figure 4C:
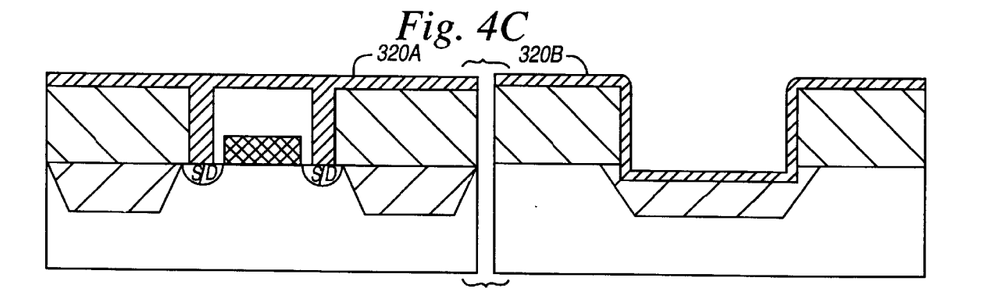

FIG. 4c shows the deposition of a first conductive 320b layer, in the example process it is tungsten (W). It is usually deposited in a thickness of 0.3 microns to 0.5 microns. The tungsten substantially conforms to the underlying topography of the trench 310b, in the alignment structure. Also the tungsten 320a substantially conforms the source and drain structure of the circuit 310a.

Figure 4D:
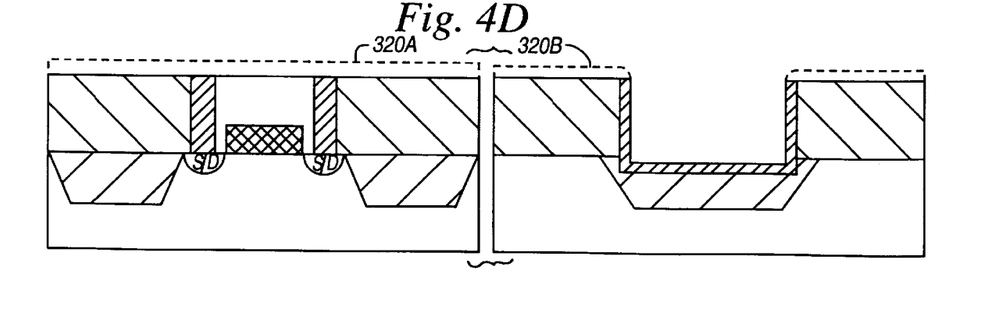

FIG. 4d shows the alignment structure and transistor structure after a CMP step. The CMP polishes the tungsten so that it is substantially flush with the surrounding oxide. The removed material is indicated by the dashed lines.

Figure 4E:
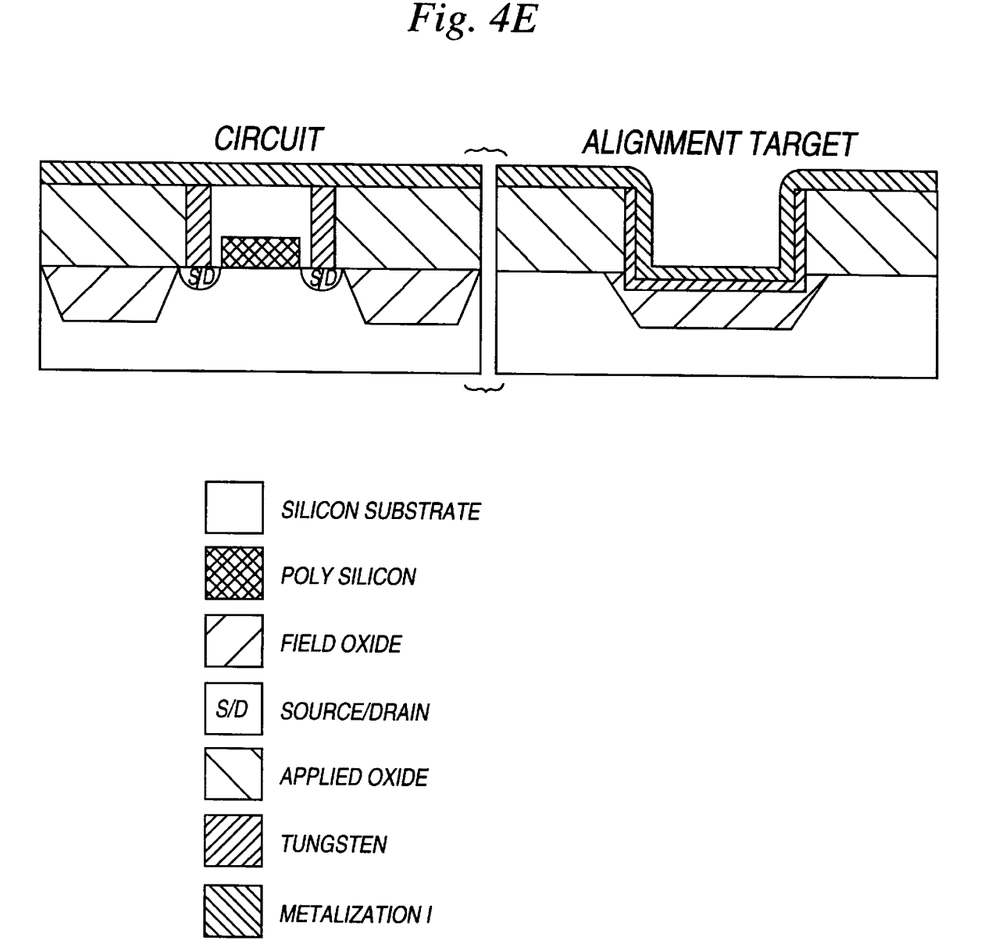

FIG. 4e shows the deposition of a second conductive layer 330a in the example circuit and 330b in the alignment structure. In a modern multilayer process, for example, this is the first metal layer and it is deposited in a thickness ranging from 0.4 microns to 1.0 microns. As in the previous embodiments, the first metal layer substantially conforms to the underlying structure, preserving a topography which will enable the aligner to receive a sufficient reflected light signature upon which to accomplish alignment.

FIG. 5 illustrates a series of steps in the making of an alignment structure in a typical modern process and the corresponding layers of the integrated circuit that is built simultaneously with the circuit beginning with the deposition of the first metal layer of the example circuit.

Figure 5A:
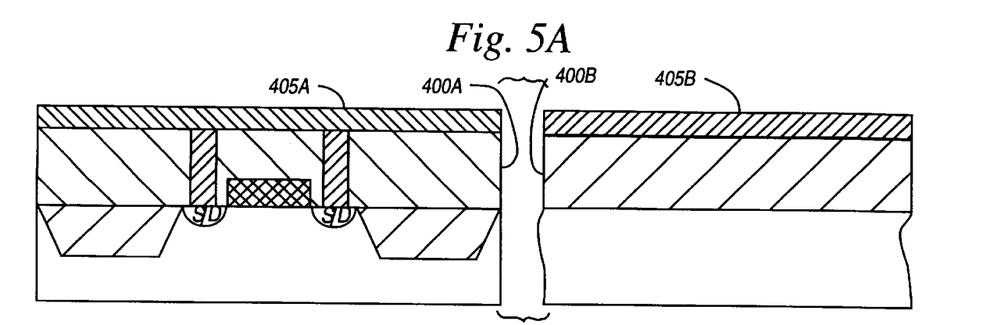
FIGS. 5a–5g illustrate a building-block outline for another embodiment of the inventive alignment structure.

FIG. 5a shows the deposition of the "first metal" 405a and 405b over the oxide 400a and 400b that had been deposited in previous steps, its thickness is typically in the range of 0.4 microns to 1.2 microns.

Figure 5B:
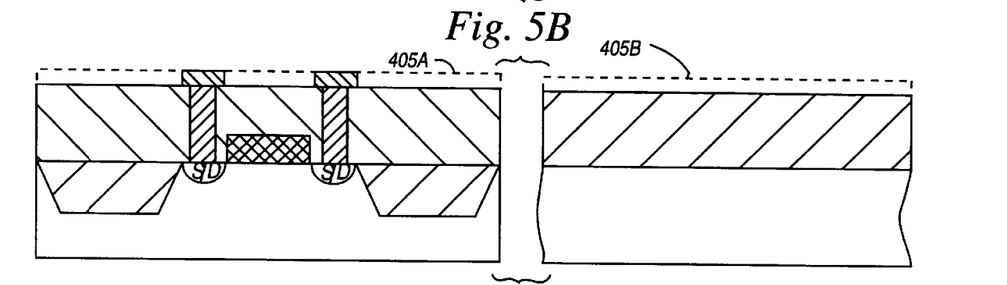

FIG. 5b shows the "first metal" pattern etch of the circuit and the alignment structure. The process completely removes "first metal" from the alignment structure leaving only the oxide 400b. Dashed lines indicate the material removed.

Figure 5C:
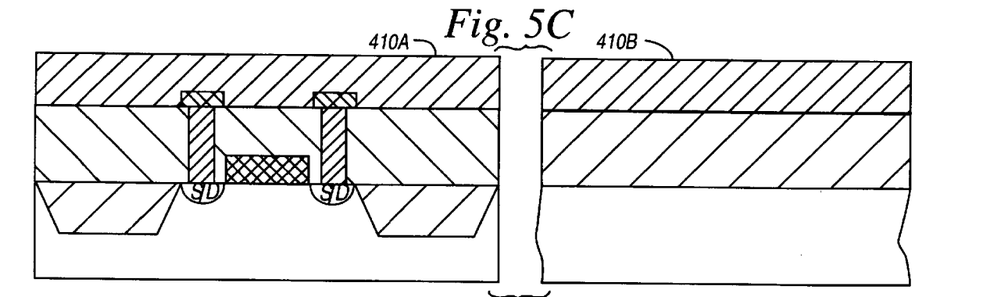

FIG. 5c shows the example circuit after the process applies a "second intermetal oxide deposition" and its planarization, 410a. The area in which the alignment structure is built has additional oxide 410b grown thereon. The thickness of this additional oxide is in the range of 1.1 microns to 1.9 microns.

Figure 5D:
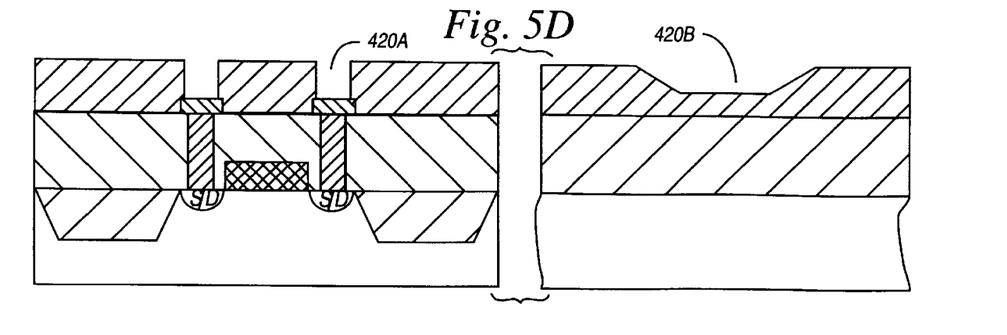

FIG. 5d shows the trench 420b of the alignment structure. In a typical process, during a "second intermetal oxide via patterning" of the circuit, 420a, the contact holes of the circuit is also created.

Figure 5E:
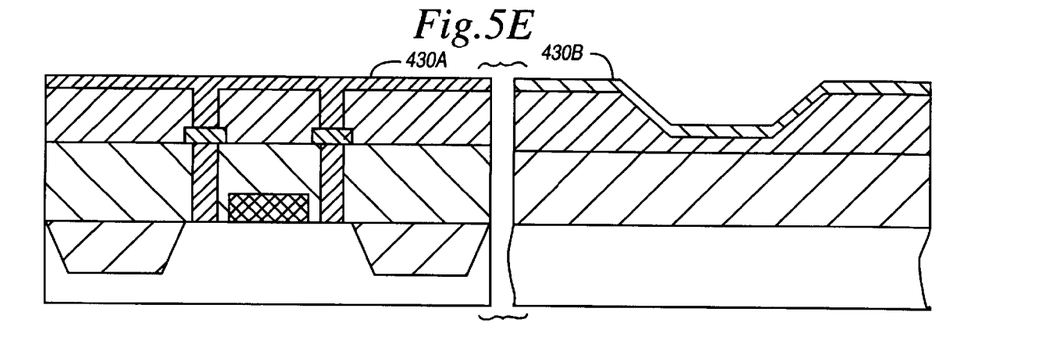

FIG. 5e shows the deposition of tungsten (W) substantially conforming to the underlying topography as shown by 430b. In the circuit, the tungsten fills in the second intermetal dielectric "via" (contact holes) patterning forming a connection to the subsequent "Metallization I." The typical thickness ranges from 0.3 microns to 0.5 microns.

Figure 5F:
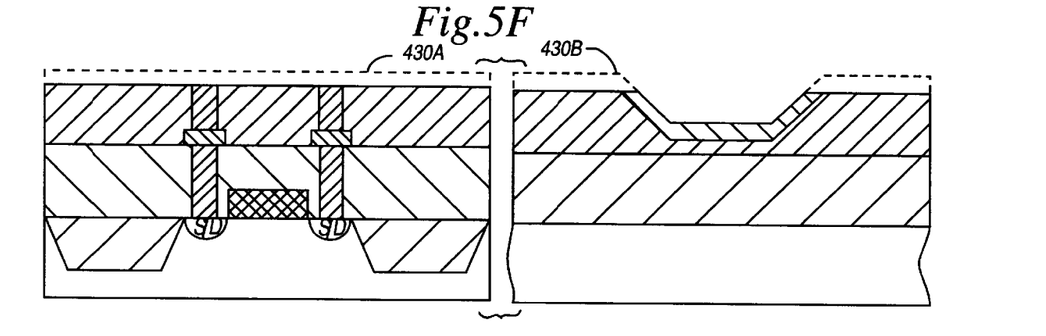

FIG. 5f shows the alignment structure and circuit after the CMP. The surface metal of 430a and 430b are polished substantially flush with the second intermetal oxide deposition shown in FIG. 5c. Removed material is indicated by the dashed lines.

Figure 5G:
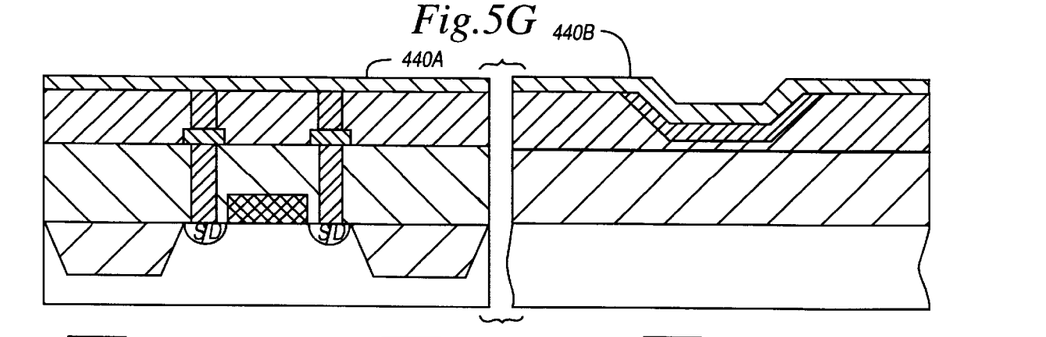

FIG. 5g shows the alignment structure 440b and circuit 440a after the "second metal" deposition. This second metal is typically applied in a thickness of 0.4 microns to 1.0 microns. As cited in the previous embodiments, the second metal layer substantially conforms to the underlying structure, preserving a topography which enables the aligner to receive a sufficient reflected light signature upon which to accomplish alignment.

The steps involved in building the alignment structure concurrently with the active circuit elements in the processes, outlined during the Metallization I and Metallization II levels, can be carried further to additional layers of metallization and contact formation in a similar manner.

While the present invention has been described with reference to several particular example embodiments, those skilled in the art will recognize that many changes may be made thereto without departing from the spirit and scope of the present invention, which is set forth in the following claims.

What is claimed is:

1. A semiconductor structure including a photo alignment target built simultaneously with an integrated circuit transistor, the integrated circuit transistor having drain, gate, and source regions and being isolated by at least one field oxide region, the semiconductor structure comprising:

a first dielectric layer deposited on the field oxide region;

at least one opening defined in the first dielectric layer located above the field oxide having a depth more than the overall thickness of the first dielectric layer but less than the thickness of field oxide region and the first dielectric layer combined;

a first metal layer over the opening of the first dielectric layer and conforming to the opening, the first metal layer having a planar top surface; and a second metal layer deposited over the planar surface of the first metal layer and conforming to the opening, to provide a topography change recognizable by an alignment apparatus.

2. A semiconductor structure, as recited in claim 1, wherein the first metal layer is Tungsten.

3. A semiconductor structure including a photo alignment target built simultaneously with an integrated circuit transistor structure, the integrated circuit transistor structure having drain, gate and source regions and being isolated by at least one field oxide region, the semiconductor structure comprising:

a first dielectric layer over the field oxide region and the transistor structure;

at least one opening defined in the first dielectric layer located above the field oxide and having a depth more than the overall thickness of the first dielectric layer but less than the thickness of the field oxide layer and the first dielectric layer combined, said at least one opening defining a contact aperture in the transistor structure that has a depth of at least the thickness of the first dielectric layer but less than the depth of the thickness of the field oxide and first dielectric layer combined;

a first metal layer deposited over the opening of the first dielectric layer and conforming to the opening, the first metal layer having a planar top surface; and a second metal layer deposited over the planar top surface and conforming to the opening, the second metal layer having a top surface in and adjacent to the opening, thereby providing a topography change recognizable by an alignment apparatus.

4. A semiconductor structure as recited in claim 3, wherein the first metal layer is Tungsten, and where in said at least one opening includes at least first and second contact apertures leading respectively to the source and drain regions.

* * * * *